(12) United States Patent
Hamamoto et al.

(10) Patent No.: US 11,612,055 B2
(45) Date of Patent: Mar. 21, 2023

(54) PRINTED WIRING BOARD AND INFORMATION PROCESSING APPARATUS

(71) Applicant: Hitachi, Ltd., Tokyo (JP)

(72) Inventors: Goro Hamamoto, Tokyo (JP); Yutaka Uematsu, Tokyo (JP); Yohei Oshima, Tokyo (JP); Maya Hyakudomi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 36 days.

(21) Appl. No.: 17/380,079

(22) Filed: Jul. 20, 2021

(65) Prior Publication Data
US 2022/0030706 A1 Jan. 27, 2022

(30) Foreign Application Priority Data
Jul. 22, 2020 (JP) .............................. JP2020-125150

(51) Int. Cl.
 *H05K 1/02* (2006.01)
 *H05K 3/28* (2006.01)
(52) U.S. Cl.
 CPC ............. *H05K 1/0296* (2013.01); *H05K 3/28* (2013.01); *H05K 2201/10098* (2013.01); *H05K 2201/10159* (2013.01)
(58) Field of Classification Search
 CPC ................... H05K 1/0296; H05K 3/28; H05K 2201/10098; H05K 2201/10159
 USPC .......................................................... 361/772
 See application file for complete search history.

(56) References Cited

U.S. PATENT DOCUMENTS

2012/0250264 A1  10/2012  Osanai et al.

FOREIGN PATENT DOCUMENTS

JP    2009-086841 A    4/2009

OTHER PUBLICATIONS

Extended European Search Report dated Dec. 20, 2021, issued in corresponding EU Application No. 21182731.6.

*Primary Examiner* — Tremesha S Willis
(74) *Attorney, Agent, or Firm* — Mattingly & Malur, PC

(57) ABSTRACT

In a printed wiring board, one transmitting circuit and N (N is an integer of 3 or more) receiving circuits are coupled by a multi-point wiring. First to N-th branch points are provided in sequence in the multi-point wiring having one end coupled to the transmitting circuit. Wirings branched at the respective branch points are coupled to the respective receiving circuits. Here, a wiring length from a coupling point of the transmitting circuit to a first branch point is configured to be longer than a wiring length from the first branch point to the second branch point. Wiring lengths between the adjacent branch points at and after a second branch point are configured to be shorter than the wiring length from the first branch point to the second branch point.

5 Claims, 5 Drawing Sheets

PRINTED WIRING BOARD AND INFORMATION PROCESSING APPARATUS

CROSS-REFERENCES TO RELATED APPLICATIONS

The present invention contains subject matter related to Japanese Patent Application JP2020-125150 filed in the Japanese Patent Office on Jul. 22, 2020, the entire contents of which being incorporated herein by reference.

BACKGROUND

The present invention relates to a printed wiring board and an information processing apparatus.

A memory device mounted to an information processing apparatus includes, for example, a plurality of Synchronous Dynamic Random Access Memories (SDRAMs) and a memory controller (controller Large Scale Integration: LSI) that controls writing and reading of the SDRAMs. As the SDRAM, a Double-Data-Rate SDRAM (DDR SDRAM) is generally used.

The plurality of SDRAMs and the memory controller are mounted to a printed wiring board.

The memory controller transmits address (Add), command (Cmd), and control (Ctrl) signals to each SDRAM in a wiring pattern formed on the printed wiring board referred to as a multi-point wiring. In the multi-point wiring in this case, the memory controller is a transmission end and the plurality of SDRAMs are reception ends.

To couple the memory controller and the plurality of SDRAMs by the multi-point wiring, a wiring pitch and a wiring length need to be appropriately selected. An inappropriate wiring length generates reflection in a negative direction in the transmission signal due to a capacitive component (capacitance) that the SDRAM has. Therefore, the reflection component is superimposed on the received waveform of the SDRAM and causes a ring-back, and this makes it difficult to appropriately maintain a digital threshold. This results in decrease in voltage margin, failing to correctly transmit the signal. Japanese Unexamined Patent Application Publication No. 2009-86841 describes an example of the multi-point wiring.

SUMMARY

To improve performance of the information processing apparatus, a high speed and a large capacity are indispensable for the printed circuit board that includes the memories, such as the SDRAMs. Here, the above-described multi-point wiring has a plurality of branches and the plurality of memories are coupled to the multi-point wiring. Therefore, the multi-point wiring is likely to be accompanied by a waveform distortion due to undesired reflection, and improvement in waveform quality and improvement in reliability are objects.

For the objects, the technique described in Japanese Unexamined Patent Application Publication No. 2009-86841 sets distances between respective branches after a distance of a multi-point wiring from a memory controller to the first branch longer than or at least same as the distance from the memory controller to the first branch to reduce undesired reflection in the multi-point wiring.

However, as described above, the technique described in Japanese Unexamined Patent Application Publication No. 2009-86841 has a problem of the long total wiring length of the multi-point wiring. That is, the distance from the memory controller to the first branch requires the distance to some extent in terms of arrangement of respective components on a printed circuit board, and when the equivalent distance or more is set to the distances between the respective branches, the total wiring length becomes considerably long.

Meanwhile, the maximum wiring length or the like of the component, such as the memory controller, is determined as a specification designated by a vendor, and the above-described multi-point wiring also needs to be designed to have the wiring length meeting the specification.

As a specific example, there is a memory controller (LSI) whose difference in wiring length between clock, address, command, and control signals; and a data strobe signal is regulated to be within 50.8 mm and the wiring length of the data strobe signal is restricted to be within 100 mm. In the case, even when it is attempted to decrease a linear distance to the SDRAM at the farthest end from the memory controller, it is difficult because of the following reasons.

That is, when the total length of the address, command, and control signals lengthens, after the arrangement pitches of the SDRAMs are decreased, a large number of bent portions referred to as a meander wiring need to be provided in the wiring that connect between the respective SDRAMs to lengthen the distance. Furthermore, to reduce a crosstalk, it is necessary to provide large spaces between the respective wirings, and as a result, configuring the regulated wiring length is difficult.

An object of the present invention is to provide a printed wiring board that allows transmitting excellent signals without lengthening a total wiring length of a multi-point wiring and an information processing apparatus that includes the printed wiring board.

To solve the above-described problems, for example, the configurations described in the claims are employed.

While this application includes a plurality of means to solve the problems, one example is a printed wiring board in which one transmitting circuit and N (N is an integer of 3 or more) receiving circuits are coupled by a multi-point wiring. First to N-th branch points are provided in sequence in the multi-point wiring having one end coupled to the transmitting circuit. Wirings branched at the respective branch points is coupled to the respective receiving circuits.

A wiring length from a coupling point of the transmitting circuit in the multi-point wiring to a first branch point is configured to be longer than a wiring length from the first branch point to a second branch point. Wiring lengths between the adjacent branch points at and after the second branch point are configured to be shorter than the wiring length from the first branch point to the second branch point.

With the present invention, in the multi-point wiring applied to a wiring of memory devices or the like, a voltage margin for an external noise, such as a crosstalk, can be ensured, and therefore high waveform quality can be obtained and a signal can be excellently transmitted to a plurality of receiving circuits.

Problems, configurations, and effects other than ones described above will be clarified in the following explanation of embodiments.

DETAILED DESCRIPTION

Hereinafter, one exemplary embodiment of the present invention (hereinafter referred to as "this example" will be described with reference to the attached drawings.

Configuration of Information Processing Apparatus

Figure 1:
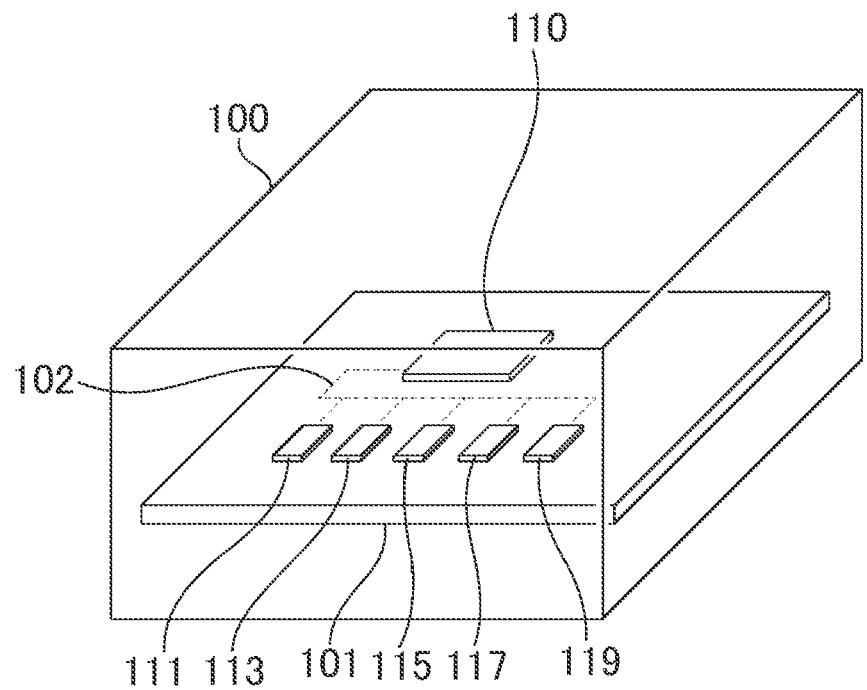
FIG. 1 is a block diagram illustrating an outline of an information processing apparatus (example 1) that applies a printed wiring board according to one exemplary embodiment of the present invention.
Figure 2:
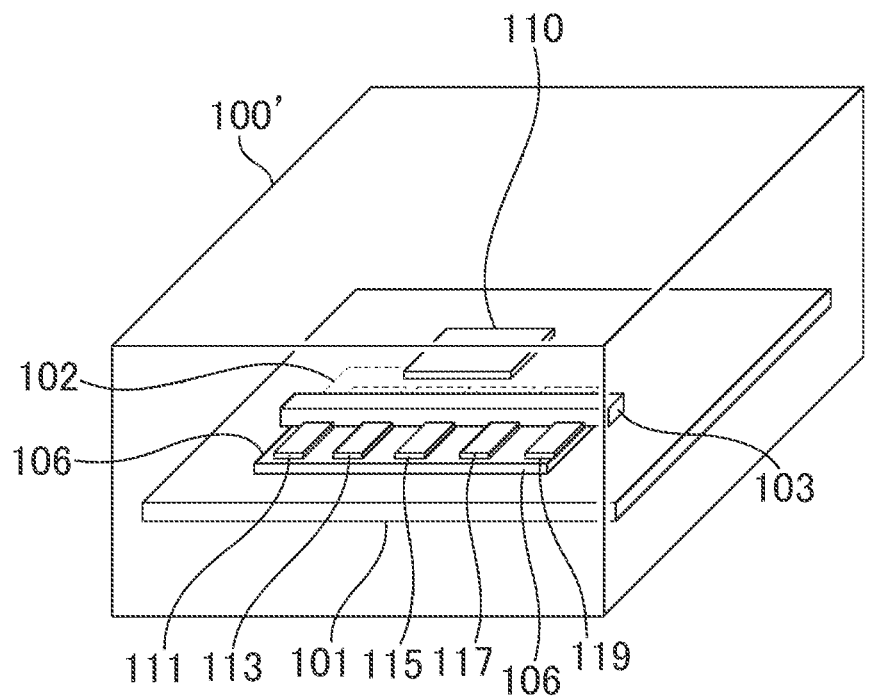
FIG. 2 is a block diagram illustrating an outline of an information processing apparatus (example 2) that applies the printed wiring board according to one exemplary embodiment of the present invention.

FIG. 1 and FIG. 2 illustrate an outline of the information processing apparatus that includes a printed wiring board of this example.

An information processing apparatus 100 illustrated in FIG. 1 includes a printed wiring board 101. To the printed wiring board 101, one memory controller 110 and a plurality of memory devices 111 to 119 are directly mounted. The plurality of memory devices 111 to 119 are mounted on both surfaces of the printed wiring board 101. That is, FIG. 1 illustrates only the memory devices 111, 113, 115, 117, and 119 mounted on the front surface of the printed wiring board 101 and does not illustrate the memory devices 112, 114, 116, and 118 mounted on the back surface of the printed wiring board 101. The same applies to FIG. 2 described later.

A multi-point wiring 102 couples between the memory controller 110 and the respective memory devices 111 to 119.

The respective memory devices 111 to 119 are DDR SDRAMs, and the memory controller 110 controls writing and reading of data in the respective memory devices 111 to 119. To perform this control, the memory controller 110 transmits address, command, and control signals to the respective memory devices 111 to 119 via the multi-point wiring 102.

FIG. 2 illustrates a configuration of an information processing apparatus 100' having another configuration.

In the information processing apparatus 100' illustrated in FIG. 2, a connector 103 is mounted to the printed wiring board 101. To the connector 103, the plurality of memory devices 111 to 119 mounted on a sub-substrate 106 are coupled. The sub-substrate 106 on which the plurality of memory devices 111 to 119 are thus mounted is referred to as a Dual Inline Memory Module (DIMM) card or the like.

The memory controller 110 is directly mounted to the printed wiring board 101.

Similarly to the information processing apparatus 100 illustrated in FIG. 1, in the information processing apparatus 100' illustrated in FIG. 2, the plurality of memory devices 111 to 119 are mounted on both surfaces of the printed wiring board 101, but FIG. 2 illustrates only the memory devices 111, 113, 115, 117, and 119 mounted on the front surface.

In the printed wiring board 101 illustrated in FIG. 2 as well, the memory controller 110 transmits the address, command, and control signals to the respective memory devices 111 to 119 via the multi-point wiring 102.

Configuration of Multi-Point Wiring

Figure 3:
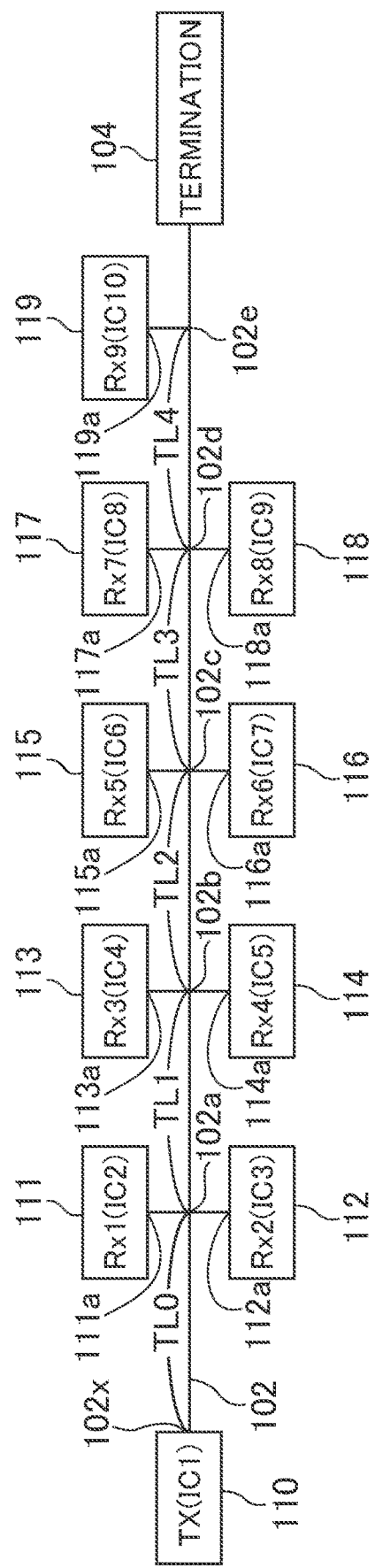
FIG. 3 is a drawing illustrating an example of a wiring structure of the printed wiring board according to one exemplary embodiment of the present invention.

FIG. 3 illustrates an exemplary configuration of the multi-point wiring 102 formed on the printed wiring board 101. The multi-point wiring 102 of this example may be applied in both cases where the memory devices 111 to 119 are directly mounted to the printed wiring board 101 as illustrated in FIG. 1 and where the memory devices 111 to 119 are mounted to the printed wiring board 101 via the connector 103 as illustrated in FIG. 2.

To the memory controller 110, which is a transmitting circuit of the address, command, and control signals, a starting end (one end) 102x of the multi-point wiring 102 is coupled. Branch points 102a, 102b, 102c, 102d, and 102e are provided at a plurality of positions in the multi-point wiring 102, and a termination resistor 104 is coupled at a termination (the other end).

Wirings branched at the respective branch points 102a to 102e are coupled to coupling portions 111a to 119a of the respective memory devices 111 to 119. As already described, the respective memory devices 111 to 119 are dividedly disposed on the front surface and the back surface of the printed wiring board 101. Accordingly, at the respective branch points 102a, 102b, 102c, and 102d, branches to the memory devices 111, 113, 115, and 117, which are disposed on the front surface side, and branches to the memory devices 112, 114, 116, and 118, which are disposed on the back surface side, are formed. At the branch point 102e, only a branch to the memory device 119 on the front surface side is formed.

Here, in this example, as illustrated in FIG. 3, a distance from the starting end 102x of the multi-point wiring 102 to the first branch point 102a is defined as a distance TL0. A distance from the branch point 102a of the multi-point wiring 102 to the adjacent branch point 102b is defined as a distance TL1, and hereinafter, distances between the branch points 102b and 102c, the branch points 102c and 102d, and the branch points 102d and 102e are defined as distances TL2, TL3, and TL4, respectively.

FIG. 3 illustrates the multi-point wiring 102 in a linear shape, but is actually disposed so as to appropriately have bent portions according to the shape of the printed wiring board 101 and the arranged positions of the respective memory devices 111 to 119. While FIG. 3 illustrates the respective distances TL0 to TL4 having approximately equal distances, but the distances are actually not the same as described below.

Example of Respective Distances TL0 to TL4 of Multi-Point Wiring

In this example, the following values are set to the respective distances TL0 to TL4 of the multi-point wiring 102.

TL0: 90.2 mm
TL1: 24.1 mm
TL2: 22.3 mm
TL3: 20.6 mm
TL4: 17.2 mm

Thus, the distance TL0 from the starting end 102x of the multi-point wiring 102 as the coupling point with the memory controller 110 to the first branch point 102a is set to a value longer than the distance TL1 from the first branch point 102a to the next branch point 102b.

Additionally, the distance TL1 from the first branch point 102a to the next branch point 102b is set to a value longer than the distances TL2, TL3, and TL4 between the subsequent adjacent branch points 102b, 102c, 102d, and 102e.

Furthermore, in this example, the distances TL1 to TL4 between the respective adjacent branch points 102a to 102e are set to gradually decreasing values as away from the starting end 102x, and thus the respective distances TL0 to TL4 are set at non-equal spacing pitches. Note that lengths of branch wirings from the respective branch points 102a to 102e of the multi-point wiring 102 to the coupling portions 111a to 119a of the respective memory devices 111 to 119 are preferably set to be an approximately same length.

Note that a distance from the starting end 102x of the multi-point wiring 102 to the coupling portion 119a of the memory device 119 at the position farthest from the starting end 102x is set to have a length equal to or less than a length regulated by a vendor of the memory device as a wiring length connectable to the memory devices 111 to 119.

As illustrated in FIG. 2, when the connector 103 is mounted to the printed wiring board 101, the connector 103 is preferably present at the branch wirings between the respective branch points 102a to 102e and the coupling portions 111a to 119a of the respective memory devices 111 to 119.

Examples of Received Waveforms in Respective Memory Devices

Figure 4:
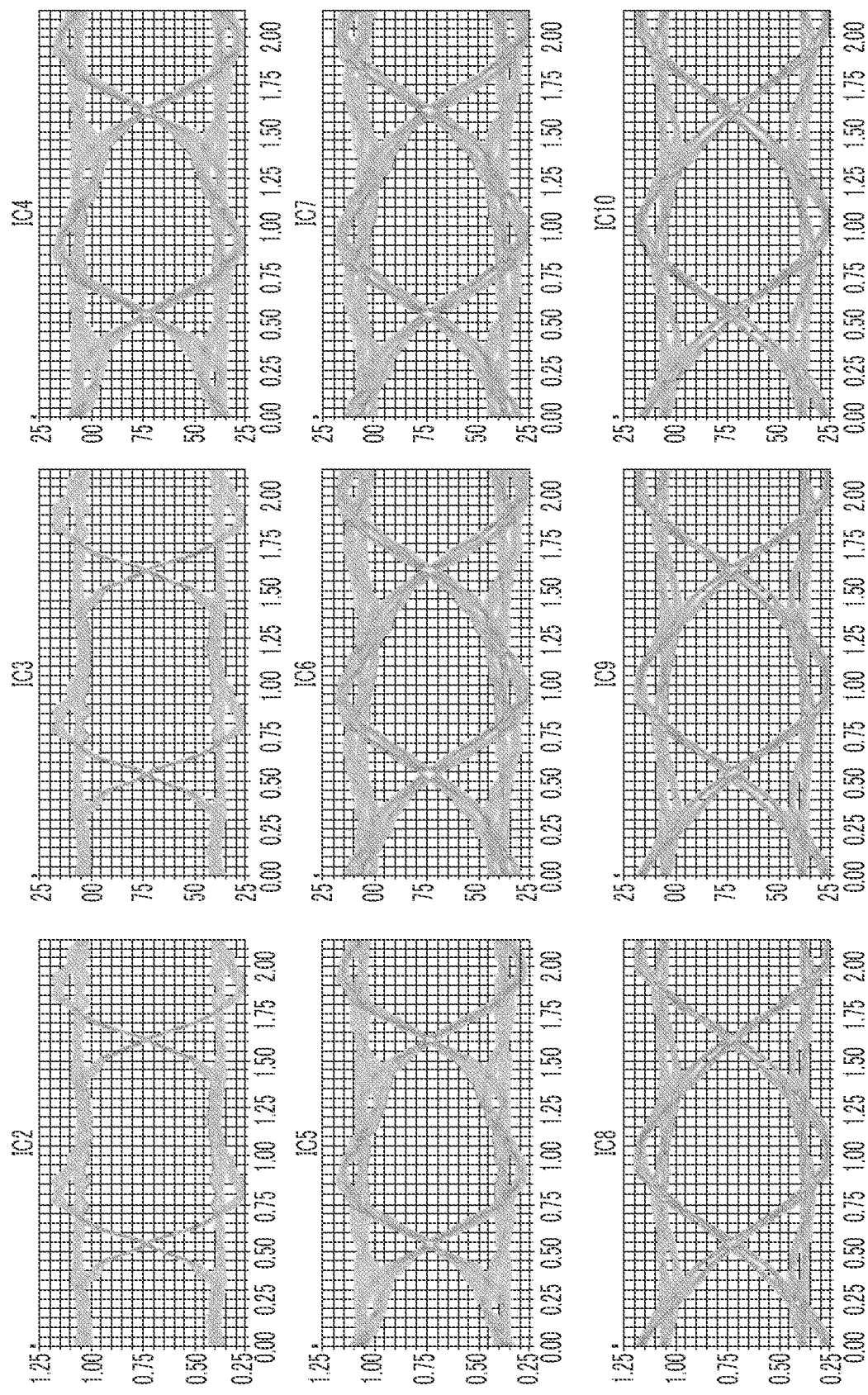
FIG. 4 is a drawing illustrating an example of a received waveform in each memory device when transmission is performed in the printed wiring board according to one exemplary embodiment of the present invention.

FIG. 4 illustrates the examples of the received waveforms at the coupling portions 111a to 119a of the respective memory devices 111 to 119 in the case where the respective distances TL0 to TL4 of the multi-point wiring 102 are set as described above.

Figure 5:
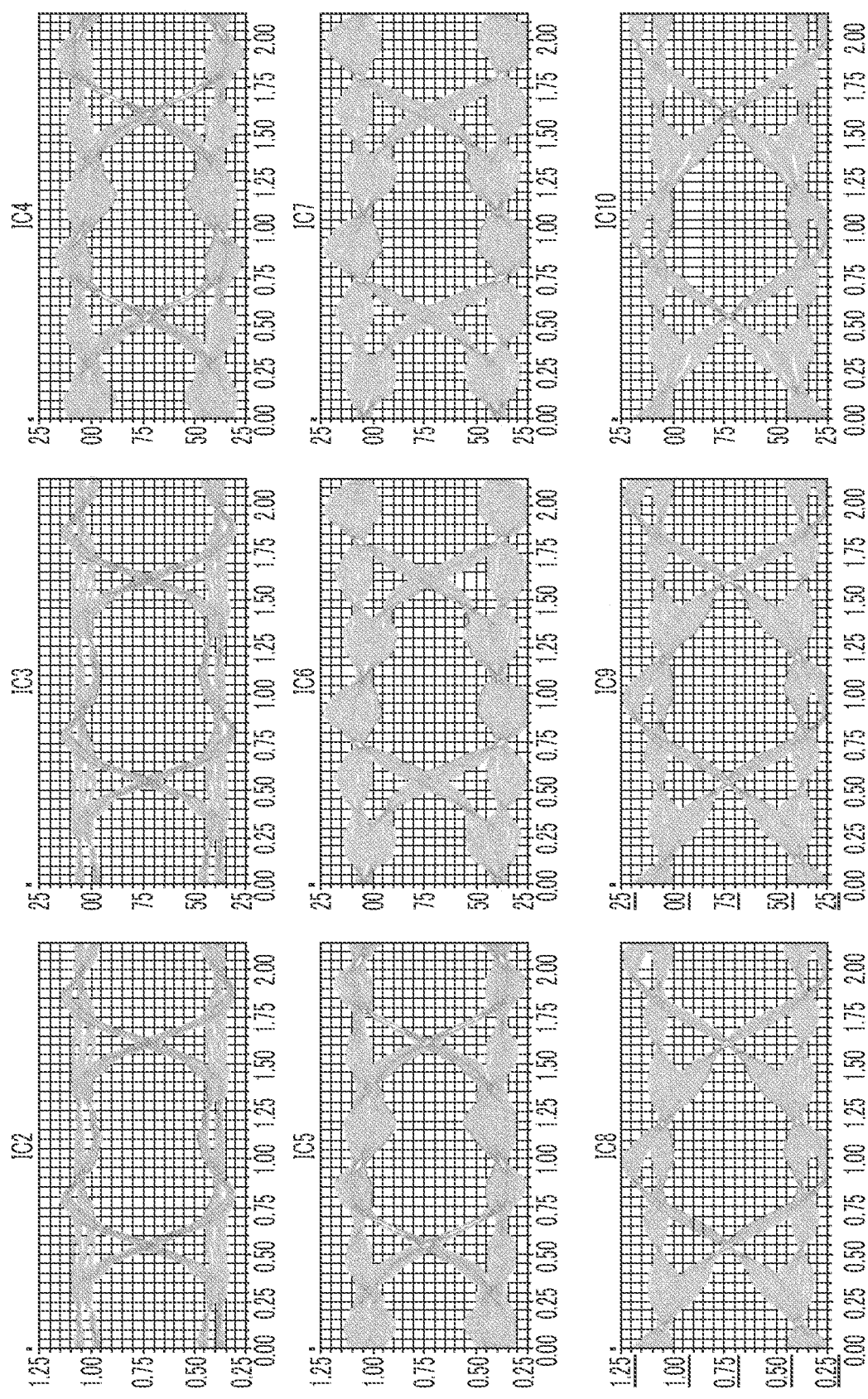
FIG. 5 is a drawing illustrating an example of a received waveform in each memory device at an equal spacing pitch where the present invention is not applied.

For comparison, FIG. 5 illustrates examples of received waveforms at the coupling portions 111a to 119a of the respective memory devices 111 to 119 in the case where the respective distances TL0 to TL4 of the multi-point wiring 102 are set to be different lengths for reference. In the examples of FIG. 5, the respective distances TL0 to TL4 of the multi-point wiring 102 are set to the following values.

TL0: 90.2 mm
TL1: 17.25 mm
TL2: 17.25 mm
TL3: 17.25 mm
TL4: 17.25 mm

That is, in the examples of FIG. 5, although the point that the distance TL0 is the longest is same as this example illustrated in FIG. 4, the other distances TL1 to TL4 are all set to be an equal interval with the same length.

In FIG. 4 and FIG. 5, IC2, IC3, IC4, IC5, IC6, IC7, IC8, IC9, and IC10 denote the received waveforms at the coupling portions 111a to 119a of the nine memory devices 111 to 119.

FIG. 4 and FIG. 5 illustrate the waveforms appearing at the coupling portions 111a to 119a of the respective memory devices 111 to 119 (IC2 to IC10) as eye patterns. The eye pattern is generated by overlapping a large number of sampled transitions of signal waveforms for display.

When a width of a line in the eye pattern is narrow (in the case of what is called a pattern of an open eye mask), the waveform has a good quality, and when the width of the line is wide (in the case of what is called a pattern of a closed eye mask), the waveform is distorted and has a poor quality. From the eye patterns of FIG. 4 and FIG. 5, it is seen that the eye pattern of FIG. 4 forms the waveform having the better quality than that of the eye pattern of FIG. 5.

Figure 6A:
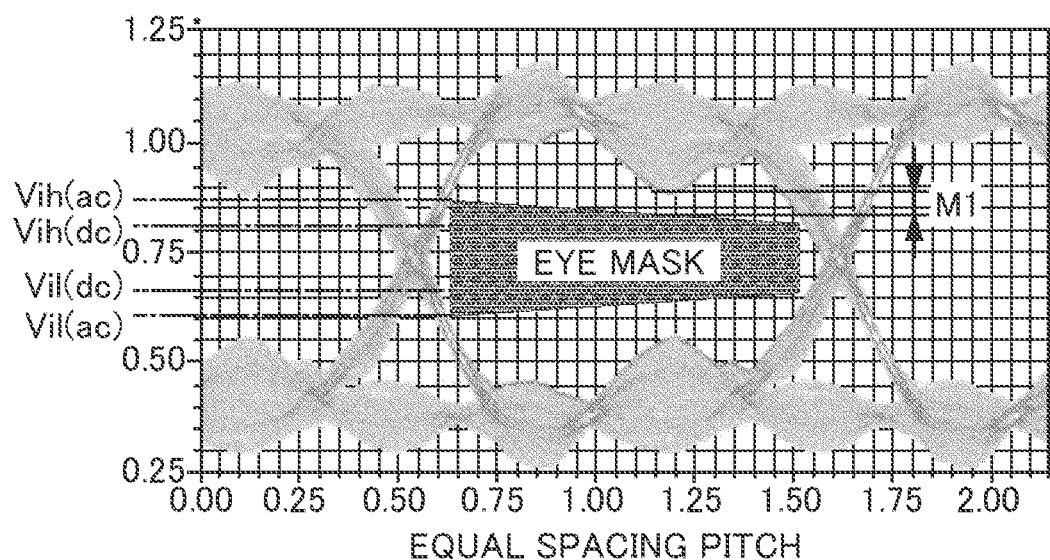
FIG. 6A and FIG. 6B are drawings for a comparison between a waveform at the equal spacing pitch (FIG. 6A) and a waveform at a non-equal spacing pitch (FIG. 6B).
Figure 6B:
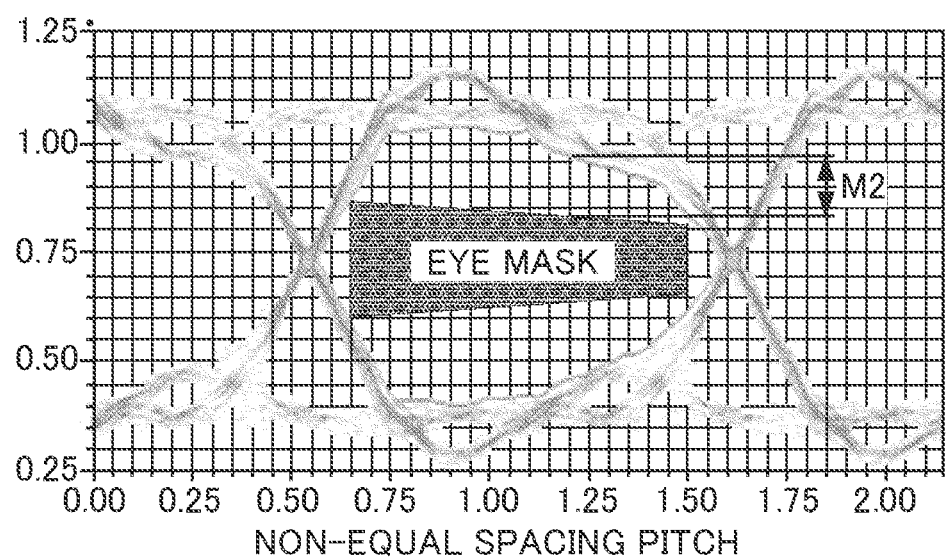

FIG. 6A and FIG. 6B illustrate examples of the eye masks in the eye patterns.

That is, FIG. 6A and FIG. 6B illustrate a relationship between a threshold and a waveform in DDR memory interfaces applied to the DDR SDRAMs as the memory devices 111 to 119 of this example.

FIG. 6A illustrates the equal spacing pitch, that is, the eye pattern of the memory device 113 (IC4) in the example of FIG. 5. FIG. 6B illustrates the non-equal spacing pitch, that is, the eye pattern of the memory device 113 (IC4) in this example illustrated in FIG. 4.

In FIG. 6A, Vih(ac) and Vil(ac) denote threshold voltages used in a setup time, and Vih(dc) and Vil(dc) denote threshold voltages used in a hold time.

The eye masks are regulated by these threshold voltages Vih(ac), Vil(ac), Vih(dc), and Vil(dc). In the DDR memory interface, since the threshold voltages Vih (dc) and Vil (dc) used in the hold time are lower than the threshold voltages Vih(ac) and Vil(ac) used in the setup time, the eye mask has a trapezoidal shape.

Distances M1 and M2 between the trapezoidal eye masks and the waveforms illustrated in FIG. 6A and FIG. 6B are margins. To properly receive data, the larger the margin for the eye mask is, the more it is preferred. Conversely, the smaller the margin for the eye mask is, the higher a possibility of failing to correctly receive data is.

Here, as seen from the comparison between FIG. 6B as the eye pattern of this example (non-equal spacing pitch) and FIG. 6A as the eye pattern at the equal spacing pitch as a comparative example, the margin M2 to the eye mask in this example is larger than the margin M1 to the eye mask at the equal spacing pitch.

FIG. 6A and FIG. 6B compare the eye patterns of the memory device 113 (IC4) coupled to the approximately middle of the multi-point wiring 102. In the case of the equal spacing pitch illustrated in FIG. 5, the margins to the eye masks are considerably small in the memory devices except for the memory devices 111 and 112 (IC2 and IC3), which are coupled to the first branch point 102a.

Meanwhile, in the case of the non-equal spacing pitch of this example illustrated in FIG. 4, although the slight decrease in margin is observed in the memory devices 113, 114, 115, and 116 (IC4, IC5, IC6, and IC7), the decrease is slight, and the margin for the eye mask is excellently ensured in any memory device.

Accordingly, the respective memory devices 111 to 119 coupled with the multi-point wiring 102 of this example can excellently receive the data from the memory controller 110 free from an error, and this contributes to a stable operation and improvement in reliability as the information processing apparatus.

The enlargement of the margin for the eye mask is achieved by reducing simultaneous superimposition of a ring-back component and a capacity reflection component appearing in the eye pattern.

That is, when the distances TL1 to TL4 between the respective branch points in the multi-point wiring 102 are at the equal spacing pitch, the ring-back component and the capacity reflection component from the influence of the received signal in other memory devices are superimposed on the received signals in the respective memory devices approximately at the same time. Thus, at the equal spacing pitch illustrated in FIG. 6A, the margin for the eye mask narrows.

On the other hand, in this example, since the multi-point wiring 102 is at the non-equal spacing pitch, the ring-back component and the capacity reflection component are not simultaneously superimposed, and as illustrated in FIG. 6B, the margin for the eye mask widens.

As described above, with the printed wiring board 101 including the multi-point wiring 102 of this example, the memory controller 110 can stably transmit the address, command, control signals to the respective memory devices 111 to 119 free from error. Accordingly, the information processing apparatus 100 (100') including the memory controller 110 and the memory devices 111 to 119 improve reliability.

Modification

The present invention is not limited to the above-described exemplary embodiments but includes various modifications.

For example, in the above-described exemplary embodiment, the relationship between the distances TL0 to TL4 meet the distances TL0>TL1>TL2>TL3>TL4. In contrast to this, when at least the distance TL0 from the starting end 102x to the first branch point 102a is configured to be longer than the distance TL1 from the first branch point 102a to the next branch point 102b, and the distance TL1 is configured to have a value longer than the distances TL2, TL3, and TL4 between the subsequent branch points 102b and 102c, the branch points 102c and 102d, and the branch points 102d and 102e, an effect of the wide margin for the eye mask is provided.

That is, as long as at least the distance TL0 from the starting end 102x to the first branch point 102a is longer than the distance TL1 from the first branch point 102a to the next branch point 102b, and the distance TL1 is longer than the distances TL2, TL3, and TL4, the distances TL2, TL3, and TL4 may be the same value. However, the distances are preferably set so as to meet TL0>TL1>TL2>TL3>TL4 as described in the above-described exemplary embodiment.

While the nine memory devices 111 to 119 are disposed, this is merely an example, and any number of the memory devices may be used. For example, the three memory devices 111, 113, and 115 may be prepared, and the three memory devices 111, 113, and 115 may be coupled to the multi-point wiring 102. In this case, it is only necessary to set the distances TL0, TL1, and TL2 to meet the relationship TL0>TL1>TL2.

While the memory devices 111 to 119 are disposed on both surfaces of the printed circuit board, this is merely an example, and the memory devices may be disposed on one surface.

The multi-point wiring 102 of this example is applicable to both of the case where the memory devices 111 to 119 are directly coupled without via the connector as illustrated in FIG. 1 and the case where the memory devices 111 to 119 are coupled using the connector 103 as illustrated in FIG. 2.

The printed wiring board 101 that includes the multi-point wiring 102 of this example may be coated with varnish to reduce corrosion or the like together with the memory controller 110 and the respective memory devices 111 to 119 mounted to the printed wiring board 101. This allows excellently using the printed wiring board 101 under corrosive gas environment. When applying the corrosion-resistant coating, when possible, as illustrated in FIG. 1, the connector is preferably not disposed as the configuration where the memory devices 111 to 119 are directly mounted to the printed wiring board 101.

Furthermore, the multi-point wiring 102 of this example is used for coupling between the memory controller and the plurality of memory devices (DDR SDRAMs). However, the similar effects can be obtained also in a case where the present invention is applied to a multi-point wiring that couples another one transmitting circuit component and a plurality of receiving circuit components.

What is claimed is:

1. A printed wiring board, comprising:
   a transmitting circuit and N (N is an integer of 3 or more) receiving circuits that are coupled by a multi-point wiring having one end coupled to the transmitting circuit,
   wherein first to N-th branch points are disposed in sequence from the multi-point wiring and wirings branched at the respective branch points are coupled to the respective receiving circuits,
   wherein a wiring length from a coupling point of the transmitting circuit in the multi-point wiring to a first branch point is configured to be longer than a wiring length from the first branch point to a second branch point,
   wherein wiring lengths between the adjacent branch points at and after the second branch point are configured to be shorter than the wiring length from the first branch point to the second branch point, and
   wherein the wiring lengths between the adjacent branch points at and after the second branch point decrease successively away from the coupling point of the transmitting circuit.

2. The printed wiring board according to claim 1,
   wherein the transmitting circuit is a memory controller, and the receiving circuits are memory devices, and
   wherein the multi-point wiring is a wiring that transmits address, command, and control signals from the memory controller to the memory devices.

3. The printed wiring board according to claim 1,
   wherein the multi-point wiring is directly coupled to the memory devices without any connector.

4. The printed wiring board according to claim 2,
   wherein a corrosion-resistant coating is applied on the printed wiring board to which the memory controller and the memory devices are mounted.

5. An information processing apparatus, comprising:
   a printed wiring board in which a transmitting circuit and N (N is an integer of 3 or more) receiving circuits that are coupled by a multi-point wiring having one end coupled to the transmitting circuit,
   wherein in the printed wiring board, first to N-th branch points are disposed in sequence from the multi-point wiring and wirings branched at the respective branch points are coupled to the respective receiving circuits,
   wherein a wiring length from a coupling point of the transmitting circuit in the multi-point wiring to a first branch point is configured to be longer than a wiring length from the first branch point to a second branch point,
   wherein wiring lengths between the adjacent branch points at and after the second branch point are configured to be shorter than the wiring length from the first branch point to the second branch point, and
   wherein the wiring lengths between the adjacent branch points at and after the second branch point decrease successively away from the coupling point of the transmitting circuit.

* * * * *